(12) United States Patent
Avraham et al.

(10) Patent No.: US 10,580,485 B2
(45) Date of Patent: Mar. 3, 2020

(54) SYSTEM AND METHOD FOR ADJUSTING READ LEVELS IN A STORAGE DEVICE BASED ON BIAS FUNCTIONS

(71) Applicant: Western Digital Technologies, Inc., San Jose, CA (US)

(72) Inventors: Dudy Avraham, Even Yehuda (IL); Alexander Bazarsky, Holon (IL); Tomer Tzvi Eliash, Kfar Saba (IL); David Rozman, Kiryat-Malakhi (IL); Eran Sharon, Rishon Lezion (IL); Arthur Shulkin, Yavne (IL)

(73) Assignee: Western Digital Technologies, Inc., San Jose, CA (US)

( * ) Notice: Subject to any disclaimer, the term of this patent is extended or adjusted under 35 U.S.C. 154(b) by 58 days.

(21) Appl. No.: 15/849,572

(22) Filed: Dec. 20, 2017

(65) Prior Publication Data

US 2019/0189202 A1    Jun. 20, 2019

(51) Int. Cl.
*G11C 11/56* (2006.01)
*G11C 16/28* (2006.01)
*G11C 16/34* (2006.01)
*G11C 16/04* (2006.01)
*G11C 16/08* (2006.01)
(Continued)

(52) U.S. Cl.
CPC ............ *G11C 11/5642* (2013.01); *G11C 7/04* (2013.01); *G11C 8/08* (2013.01); *G11C 11/5671* (2013.01); *G11C 16/0483* (2013.01); *G11C 16/08* (2013.01); *G11C 16/28* (2013.01); *G11C 16/34* (2013.01); *G11C 16/3418* (2013.01); *G11C 29/021* (2013.01); *G11C 29/028* (2013.01)

(58) Field of Classification Search
CPC ......................... G11C 11/5642; G11C 11/5671
USPC ..................................................... 365/185.03
See application file for complete search history.

(56) References Cited

U.S. PATENT DOCUMENTS

| | | | |
|---|---|---|---|
| 2009/0135646 A1* | 5/2009 | Murin | G11C 11/5642 365/185.2 |
| 2012/0124273 A1* | 5/2012 | Goss | G11C 16/349 711/103 |

(Continued)

OTHER PUBLICATIONS

Ye, "The Solution to the Bit Error Non-uniformity of 3D NAND," Flash Memory Summit, 2017, retrieved from https://www.flashmemorysummit.com/English/Collaterals/Proceedings/2017/20170809_FM22_Ye. pdf, 26 pages.*

*Primary Examiner* — Huan Hoang
*Assistant Examiner* — Muna A Techane
(74) *Attorney, Agent, or Firm* — Morgan, Lewis & Bockius LLP (57) ABSTRACT

Disclosed is a system and method for adjusting read levels in a storage device based on bias functions. The method includes receiving a request to perform a memory access operation on a wordline of non-volatile memory. The method also includes selecting a bias function corresponding to the wordline of the non-volatile memory from a group of bias functions. The method also includes determining a bias value based on the selected bias function and the wordline. The method also includes adjusting a read level in the non-volatile memory based on the bias value. The method also includes performing the memory access operation on the wordline of the non-volatile memory using the adjusted read level. The bias functions may be linear functions and adjusted in response to detecting a recalibration condition.

28 Claims, 9 Drawing Sheets

(51) Int. Cl.
*G11C 8/08* (2006.01)
*G11C 29/02* (2006.01)
*G11C 7/04* (2006.01)

(56) References Cited

U.S. PATENT DOCUMENTS

| | | | | |
|---|---|---|---|---|
| 2015/0200688 A1* | 7/2015 | Pan | ............. | H03M 13/3927 |
| | | | | 714/794 |
| 2015/0262659 A1* | 9/2015 | Cometti | ............. | G11C 11/5642 |
| | | | | 365/185.03 |
| 2016/0148701 A1* | 5/2016 | Karakulak | ............. | G11C 16/26 |
| | | | | 365/185.18 |

\* cited by examiner

FIG. 5

SYSTEM AND METHOD FOR ADJUSTING READ LEVELS IN A STORAGE DEVICE BASED ON BIAS FUNCTIONS

BACKGROUND

Increasing demand for larger capacity Solid State Drives (SSD) in smaller form factors has driven adoption of high-density flash memory structures, such as multi-level cell (MLC) flash memory. MLC flash memory devices can provide increased storage density by storing 3 bits per cell, 4 bits per cell, or more. Read thresholds are used to distinguish between various possible programmed states of the MLC memory cells.

SUMMARY

The subject technology provides a method for adjusting operating parameters in a storage device. According to aspects, a method may include receiving a request to perform a memory access operation on a wordline of non-volatile memory. The method may also include selecting a bias function corresponding to the wordline of the non-volatile memory from a group of bias functions. The method may also include determining a bias value based on the selected bias function and the wordline. The method may also include adjusting a read level in the non-volatile memory based on the bias value. The method also includes performing the memory access operation on the wordline of the non-volatile memory using the adjusted read level.

In other aspects, a non-transitory machine-readable medium may include machine-executable instructions thereon that, when executed by a computer or machine, perform a method. In this regard, the method may include receiving a request to perform a memory access operation on a wordline of non-volatile memory. The method may also include selecting a bias function corresponding to the wordline of the non-volatile memory from a group of bias functions. The method may also include determining a bias value based on the selected bias function and the wordline. The method may also include adjusting a read level in the non-volatile memory based on the bias value. The method also includes performing the memory access operation on the wordline of the non-volatile memory using the adjusted read level.

In further aspects, a system may include a processor, a non-volatile memory, and a memory media. The memory media may have instructions stored thereon that, when executed by the processor, cause the processor to receive a request to perform a memory access operation on a wordline of the non-volatile memory. The instructions also cause the processor to select a bias function corresponding to the wordline of the non-volatile memory from a group of bias functions. The instructions also cause the processor to determine a bias value based on the selected bias function and the wordline. The instructions also cause the processor to adjust a read level in the non-volatile memory based on the bias value. The instructions also cause the processor to perform the memory access operation on the wordline of the non-volatile memory using the adjusted read level.

In further aspects, a system may include a means for receiving a request to perform a memory access operation on a wordline of non-volatile memory. The system may also include a means for selecting a bias function corresponding to the wordline of the non-volatile memory from a group of bias functions. The system may also include a means for determining a bias value based on the selected bias function and the wordline. The system may also include a means for adjusting a read level in the non-volatile memory based on the bias value. The system may also include a means for performing the memory access operation on the wordline of the non-volatile memory using the adjusted read level.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

In a flash memory device, for example, with NAND architecture, memory cells are grouped in strings, with each string consisting of a set of MOS transistors connected in series between a drain select transistor, connected to a bit line of the memory block, and a source select transistor, connected to a reference voltage distribution line. Each memory cell includes a floating-gate MOS transistor. When programming a memory cell, electrons are introduced into the floating-gate, by means of Fowler-Nordheim (F-N) Tunneling. The non-volatility of the cell is due to the electrons maintained within the floating-gate even when the device power supply is removed. Bits are stored by trapping charge on the floating gate (an electrically isolated conductor) which stores a logic value defined by its threshold voltage (read threshold) commensurate with the electric charge stored. When the cell is erased, the electrons in the floating gate are pulled off by quantum tunneling (a tunnel current) from the floating gate to, for example, the source and/or substrate.

As a flash memory is cycled (that is, programmed and erased repeatedly), its physical qualities change. For example, the repeated placement and removal of electrons on the floating gate during programming and erase operations, respectively, causes some excess electrons to be trapped in the device. Also, when one or multiple cells are programmed, adjacent cells may experience an unexpected and undesired charge injection to their floating gates, thus leading to corruption of data stored therein. For instance, electrons may leak into neighboring cells after prolonged stress due to the voltages at the gates of neighboring cells. The threshold voltages of these memory cells may eventually take values that are different (higher or lower) than expected values, causing errors when the data is read. Generally, the damage done becomes a function of the field strength (voltage) and duration; that is, programming the flash memory to high threshold voltage conditions increases the rate of damage arising from both program and erase processes because it requires longer duration and/or higher applied fields. For instance, adding enough electrons can change a cell from an erased state to a programmed state.

In certain implementations, memory cells may be arranged into an array of columns (bitlines) and rows (wordlines). The address of a memory cell represents the intersection of a bitline and wordline corresponding to the memory cell.

Flash memory may be arranged into physical blocks each including multiple wordlines, for example 64 wordlines. Each wordline includes one or more pages. The number of pages in each wordline may depend on whether the flash memory comprises multi-level cells, triple-level cells, quad-level cells, or another type of memory. For example, multi-level cells may include two pages per wordline, or an upper page and a lower page, whereas triple-level cells may include three pages per wordline, or an upper page, a middle page, and a lower page.

Wordlines within a physical block may have different optimal read threshold values. To determine these optimal read threshold values, various algorithms may be utilized such as CVD tracking, BER Estimation Scan (BES), valley search, or others.

For example, a BER Estimation Scan may proceed by assigning default read thresholds for a group of blocks. A number of testing iterations may be performed to read wordlines of representative programmed blocks using the default read thresholds, which are adjusted by a voltage offset that changes for each iteration. For example, five testing iterations with voltage offsets of −0.250 mV, −0.125 mV, 0 mV, +0.125 mV, and +0.250 mV may be performed. The iteration with the smallest bit error rate (BER) for each wordline may be determined and the associated adjusted read thresholds can be estimated to be the optimal read thresholds for the wordlines within the group of blocks.

Without a determination of the optimal read threshold values for each wordline, the bit error rate (BER) may increase during SSD operation, which negatively affects SSD device operation in several ways. For example, increased BER increases error correction load, reducing processor cycles available to service normal operation requests. As a result, SSD device performance may be compromised, for example by increasing latency and reducing throughput. Increased BER may also reduce SSD endurance due to increased write amplification from block relocation.

Figure 1A:
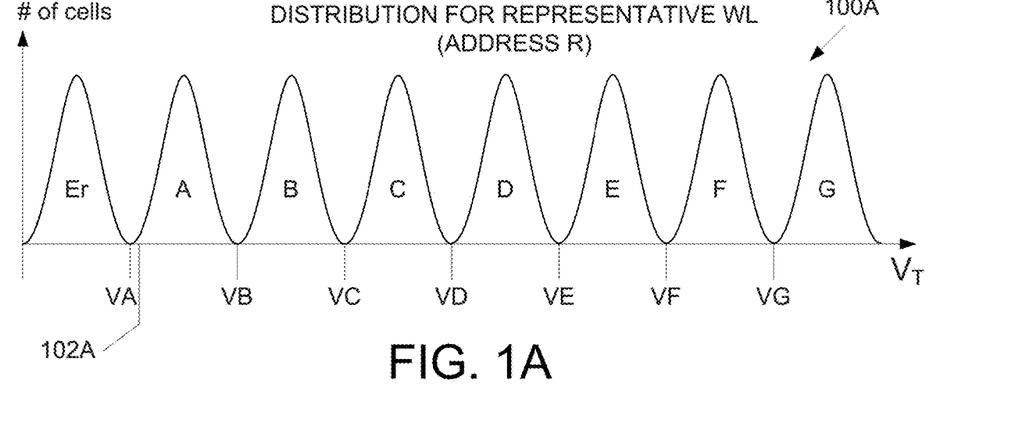
FIG. 1A is a distribution of memory cell voltages sampled for a representative wordline address R.
Figure 1B:
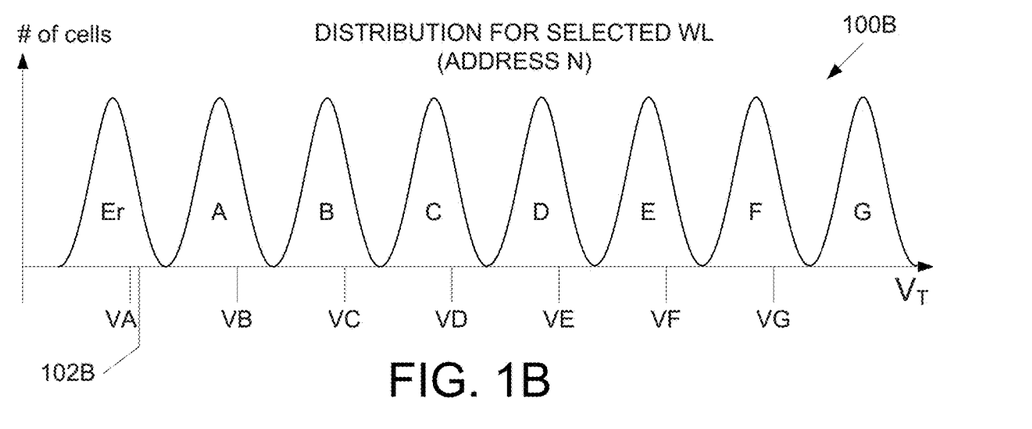
FIG. 1B is a distribution of memory cell voltages sampled for a selected wordline address N.

The problem of wordlines having different optimal threshold values is illustrated in conjunction with FIGS. 1A and 1B, which show distributions 100A and 100B of memory cell voltages sampled for respective wordline addresses R and N. Referring to FIG. 1A, a representative wordline at address R is selected. Voltage levels of storage elements, or TLC memory cells in FIG. 1A, are sampled for wordlines at address R. As shown by distribution 100A in FIG. 1A, the TLC memory cells may be approximately equally distributed across the various possible memory cell states, or Er (Erased), A, B, C, D, E, F, and G. These states may correspond respectively to 3-bit values 111, 110, 100, 000, 010, 011, 001, and 101, or to another encoding scheme.

Based on distribution 100A, read thresholds $V_T$ between program states, or VA, VB, VC, VD, VE, VF, and VG, can be determined. As discussed above, to estimate these read thresholds for a representative wordline such as wordline address R, various algorithms may be utilized such as CVD tracking, BER Estimation Scan (BES), valley search, or others. These read thresholds may be applied for a group of blocks, which may be identified by a time and temperature tag (TT), wherein blocks in the TT group are expected to have similar read thresholds, for example as a result of being programmed at a similar time and/or temperature.

A memory state of a given memory cell can be determined by applying a read threshold voltage and determining whether a cell conducts at that read threshold voltage. For example, since sample 102A is between read thresholds VA and VB, the memory cell associated with sample 102A can be determined to correspond to state A, or 3-bit value 110. If the memory cell conducts at VA but not at VB, then the memory cell can be determined to be in state A.

As discussed above, the optimal read thresholds may not be consistent across the physical block. Thus, turning to distribution 100B of FIG. 11B, a distribution 100B is shown for wordline address N that is shifted right in comparison to distribution 100A for wordline address R. If the read thresholds determined in distribution 100A are used without adjustment for reads on wordline address N, then increased bit error rate (HER) may occur.

For example, the memory cell associated with sample 102A and the memory cell associated with sample 102B may have the same threshold voltage level, as shown in FIG. 1A and FIG. 1B. However, if the read thresholds from wordline address R are utilized as optimal read thresholds for wordline address N, then the memory cell associated with sample 102B is incorrectly determined to correspond to state A (110), rather than to the correct erased state (111). For example, the cells in the Erased (Er) state with a threshold voltage greater than VA will be incorrectly read as being in programmed state A. This error state is detected as a bit error and error corrected, for example by using error-correcting codes (ECC) such as Reed Solomon codes, Bose-Chaudhuri-Hocquenghem (BCH) codes, low-density parity check (LDPC) codes, Turbo Codes, or any other error correction scheme.

Figure 1C:
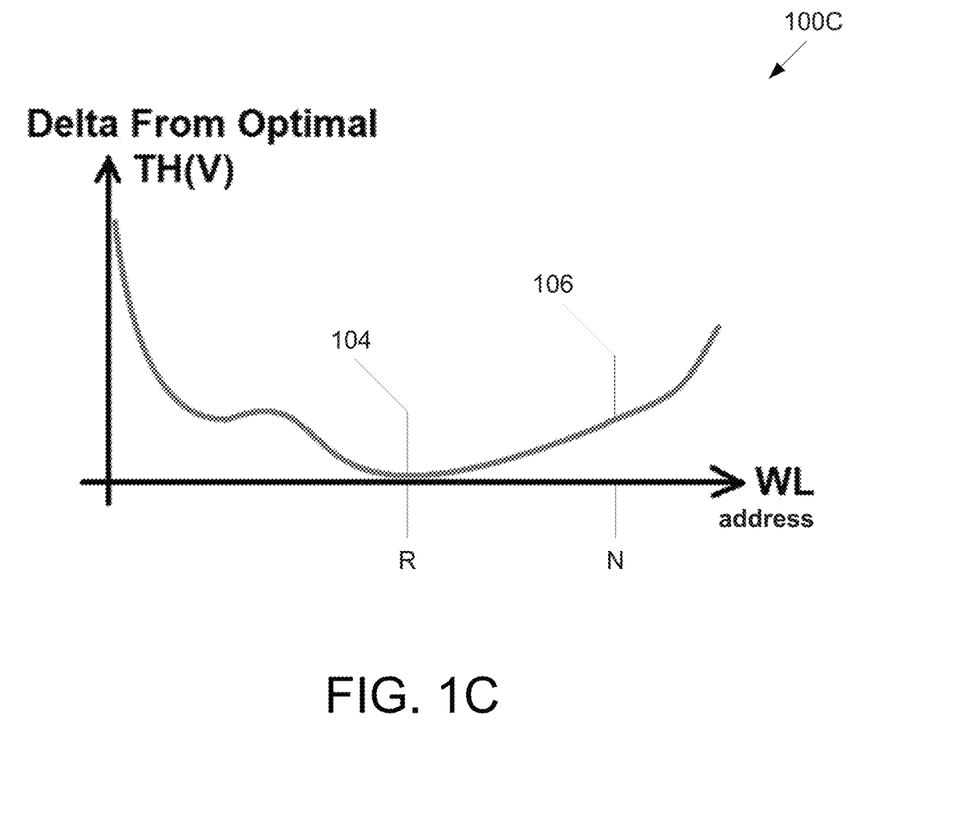
FIG. 1C is a graph diagram illustrating deltas from optimal read thresholds with wordline addresses, wherein the optimal read thresholds are measured for representative wordline addresses.

The variations from optimal read thresholds can be observed in FIG. 1C, a graph diagram 1000 illustrating deltas from optimal read thresholds with wordline addresses, wherein the optimal read thresholds are measured for representative wordlines. Thus, the read thresholds determined in distribution 100A for wordline address R are used as the optimal read thresholds, or optimal TH(V). Accordingly, delta 104 from optimal TH(V) for address R is zero volts, whereas delta 106 from optimal TH(V) for address N is a positive delta value, for example +0.500 millivolts (mV). Delta 106 indicates a shift of TH(V) to the right by 0.500 my for distribution 100B compared to distribution 100A, which is used for the optimal TH(V).

The wordline addresses shown in FIG. 1C may correspond to addresses for a flash memory block. As shown in FIG. 1C, the measured deltas from optimal read voltages can vary significantly according to wordline address. While these deltas can be mitigated by storing an adjusting bias voltage for each wordline address, this approach is not feasible from a memory standpoint. For example, when each memory block contains 64 wordlines, then each memory block also stores 64 bias values or bias voltages.

Figure 1D:
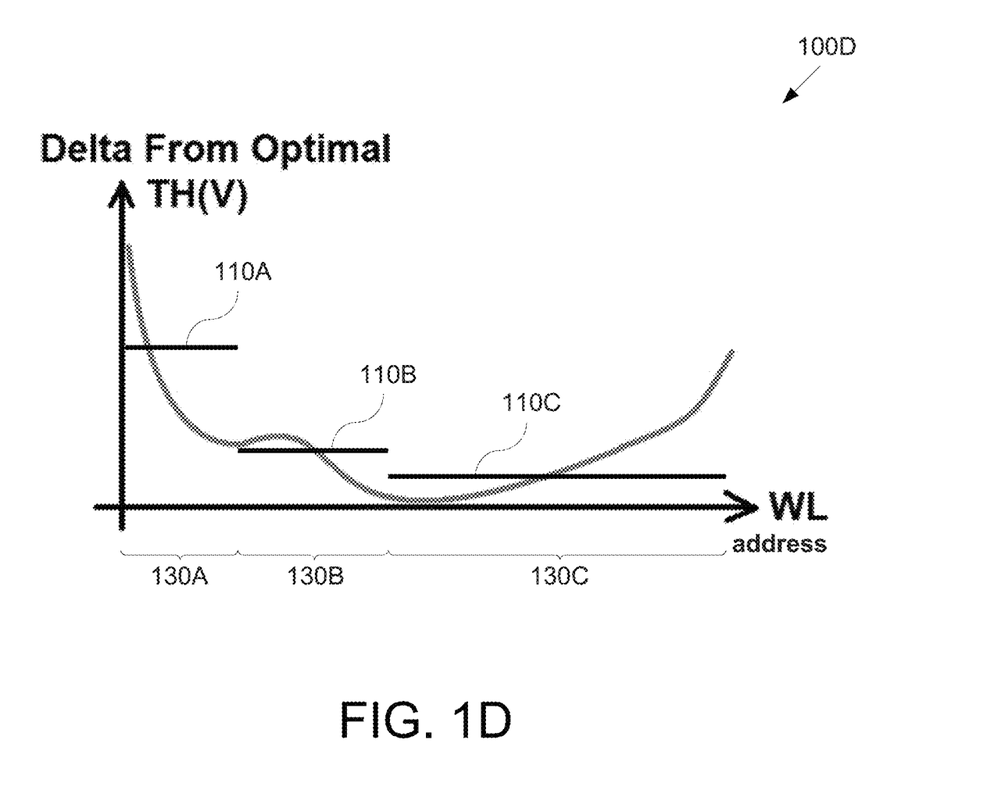
FIG. 1D is the graph diagram of FIG. 1C with constant bias wordline address zones for adjusting read thresholds.

One approach to reducing the number of bias voltages stored is illustrated in FIG. 1D, the graph diagram of FIG. 1C with constant bias wordline address zones 130A, 130B and 130C for adjusting read thresholds. As shown in FIG. 1D, the wordline addresses of a memory block are divided into three non-overlapping wordline address zones 130A, 130B, and 130C, Each wordline address zone 130A, 130B and 130C is associated with a respective constant voltage bias value 110A, 110B, and 110C. According to the wordline address of a read request to be serviced, the read thresholds can be adjusted using constant voltage bias values 110A-110C to bring the read thresholds closer to the optimal TH(V) for that wordline address.

The constant voltage bias values 110A-110C may be determined by averaging the optimal read thresholds within the respective wordline address zones 130A-130C. For example, assuming that wordline address zone 130A includes wordline addresses 0 through 10, constant voltage bias value 110A may be determined by summing the optimal read thresholds of wordline addresses 0 through 10 and dividing the sum by 11, or the number of wordline addresses in wordline address zone 130A.

Since each memory block only uses bias values for each wordline address zone, or three zones in FIG. 1D, the memory footprint can be greatly reduced. The number of wordline address zones can be significantly smaller than the number of wordline addresses in a memory block, for example 3-5 zones for 64 wordline addresses in a memory block. Further, a single copy of the bias values can be stored for multiple memory blocks, for example for TT groups as described above, further reducing the memory footprint. However, as shown in FIG. 1D, constant voltage bias values 110A-110C may not closely track the deviations from the optimal TH(V) without significant increase in zone count.

The subject technology characterizes variations from the optimal TH(V) as a function, rather than a constant bias value. For facilitated implementation and higher performance on embedded controllers with limited memory and processing resources, the function may be a linear function. However, in other aspects of the subject technology, the functions may be higher order functions to provide higher accuracy bias values.

Figure 1E:
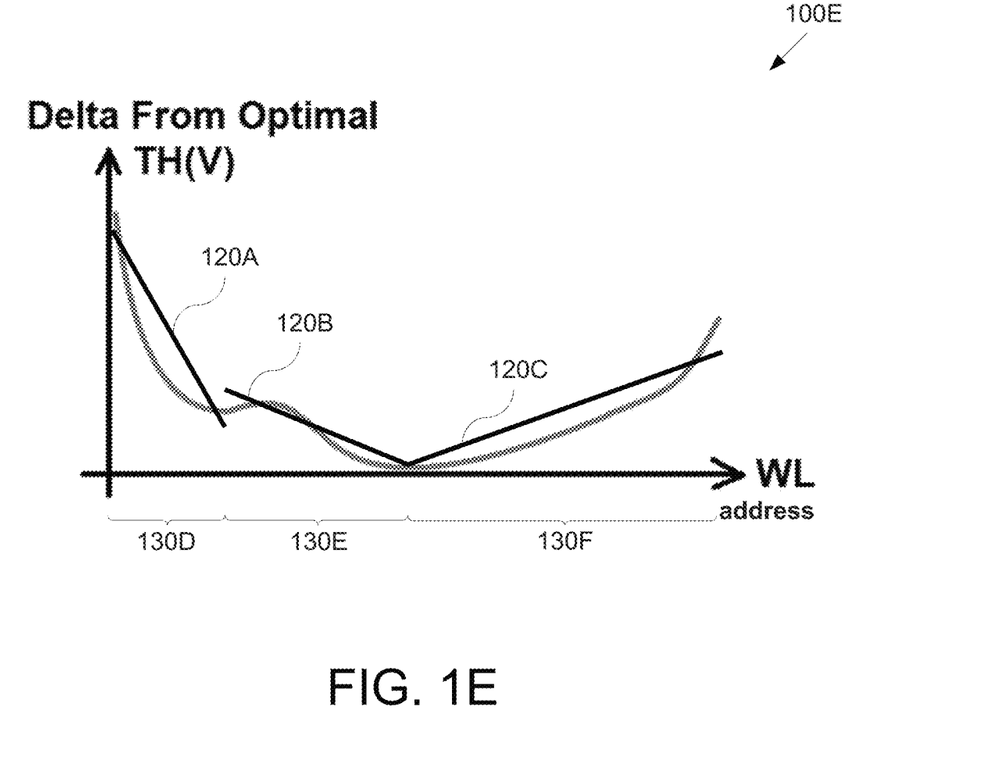
FIG. 1E is the graph diagram of FIG. 1C with functions associated with wordline address zones for adjusting read thresholds.

For example, FIG. 1E is the graph diagram of FIG. 1C with functions 120A, 120B, and 120C associated with wordline address zones 130D, 130E, and 130F for adjusting read thresholds. As shown in FIG. 1E, a number of wordless address zones is still kept to three zones, but the functions 120A-120C track the delta from optimal TH(V) much more closely. The functions 120A-120C can be determined using curve fitting or other methods. For example, the TH(V) of the endpoints ("endpoint bias values") for each wordline address zone 130D-130F may be used to determine a linear slope and a constant bias for respective functions 120A-120C, If higher order functions are used, then curve fitting may be used to generate a function having a best fit curve to the optimal bias values in each wordline address zone.

Functions 120A-120C may be linear functions that follow the form:

$$f(i) = \text{slope}(i) + \text{bias}, \qquad \text{Equation 1.}$$

In Equation 1 above, f(i)=an optimal TH(V) for the wordline address i+the first endpoint address index, wherein i is an offset from the first endpoint address index. In Equation 1 above, bias=the first endpoint bias value, and slope=$\Delta y/\Delta x$, wherein $\Delta x$=a difference in endpoint addresses in the wordline address zone, and $\Delta y$=a difference in the endpoint bias values.

Using wordline address zone 130D as an example, assume that wordline address zone 130D includes wordline addresses 0 through 10. Accordingly, the first endpoint address is address 0 and the second endpoint address is address 10. Assume the optimal TH(V) of address 0 is 1.375 mV and the optimal TH(V) of address 10 is 0.125 mV. Using Equation 1 above, bias=1.375 mV, $\Delta x$=10−0=10, and $\Delta y$=0.125 mV−1.375 mV=−1.25 mV. Accordingly, slope=−1.25 mV/10=−0.125 mV, Thus, function 120A for wordline address zone 130D corresponds to TH(V)=−0.125 mV(i)+1.375 mV, wherein i is a wordline address offset from wordline address 0.

Advantageously, functions 120A-120C can be represented as linear functions with three data points: (1) an associated wordline address zone, (2) a slope, and (3) a bias. As with constant voltage bias values 110A-110C, the functions 120A-120C can be stored and associated with a grouping of blocks, such as a TT group, rather than storing functions for every block. If a higher order function is utilized instead of a linear function, then additional data points may be stored to fully represent the higher order function. For example, if a quadratic polynomial is used where the function is in the form $f(i)=ai^2+bi+c$, then four data points (1) a wordline address zone, (2) a, (3) b, and (4) c may be stored.

Since the general trends of the wordline address zones may be maintained throughout the lifespan of the memory cells, an initial determination of functions for adjusting the read thresholds may be performed at the beginning of life (BOL) for the memory cells. The functions may be determined based on experimental data or by simulation data. In one example, the functions may be determined for a device die and programmed in a dedicated metadata area, such as a programmable read-only memory (PROM) or a non-volatile random access memory (NVRAM), or alternatively directly within the NAND memory cells. The functions may be accessed from a lookup table in working memory during device operation and backed up to non-volatile memory. When die-to-die variation is low within a wafer, then one or more representative dies may be selected to determine the initial functions to be programmed for all dies within the wafer.

Figure 2:
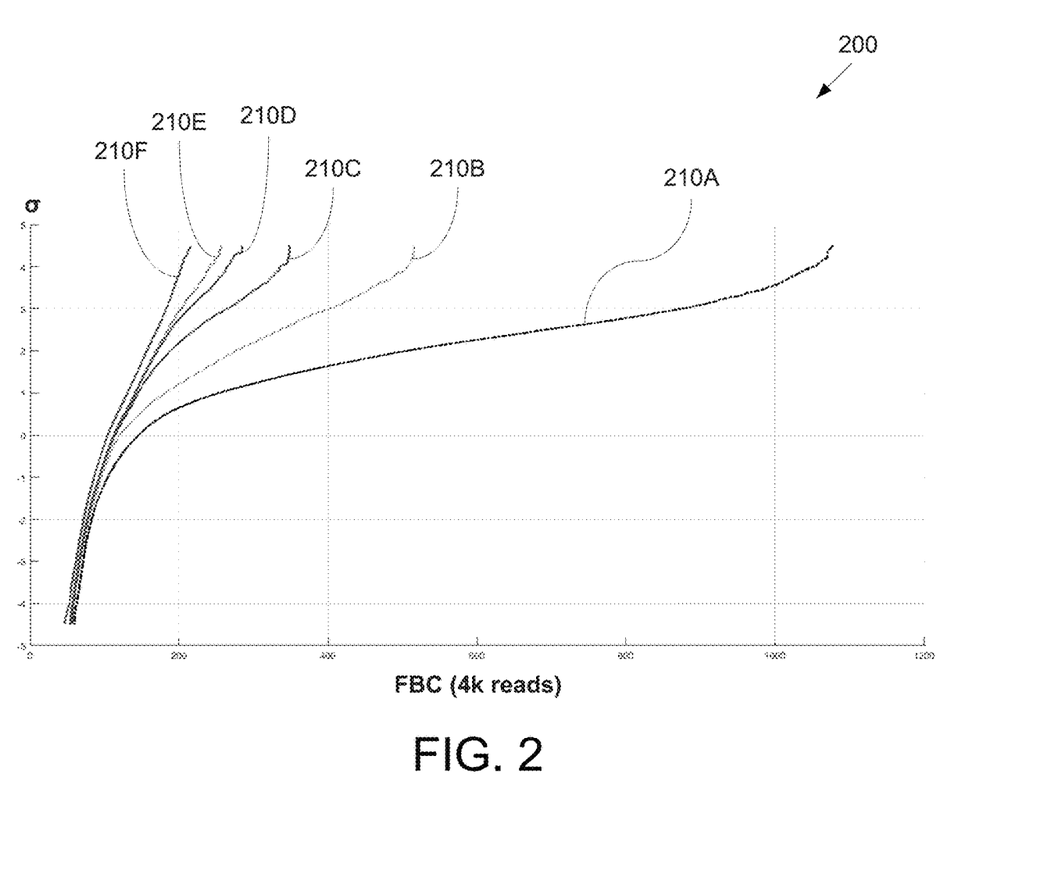
FIG. 2 is a plot diagram of sigma values to failed bit counts for sample reads of upper pages using different wordline address zone adjustments.

A comparison of the effectiveness of the various approaches to adjusting read thresholds is illustrated in FIG. 2, which shows a plot diagram 200 of sigma values to failed bit counts (FBC) for sample reads of upper pages using different wordline address zone adjustments. Plot diagram 200 arbitrarily uses upper pages as an example. The X axis of diagram 200 corresponds to failed bit counts (for 4k sample reads), whereas the Y axis of diagram 200 corresponds to sigma values, wherein larger sigma values correspond to a larger spread of sample values, or a widening of the distribution curves shown in distributions 100A and 100B.

Plot 210A corresponds to using unadjusted default read thresholds for all reads. As shown by plot 210A, the FBC rapidly increases at the sigma value increases. Plot 210B corresponds to using optimal read thresholds for a TT block that includes all memory blocks. For example, plot 210B may correspond to using the read thresholds determined for wordline address R as shown in distribution 100A of FIG. 1A. As shown in FIG. 2, plot 210B already significantly improves the FRC over plot 210A, but still has room for improvement.

Plot 210C corresponds to using three wordline address zones with constant bias voltages, corresponding to the example illustrated in FIG. 1D. Plot 210D corresponds to using three functions for three wordlines address zones, corresponding to the example illustrated in FIG. 1E. Plot 210E corresponds to using 64 wordline address zones with constant bias voltages, as described in conjunction with FIG. 1C Plot 210F corresponds to a theoretical optimum that removes all deltas from optimal TH(V) shown in FIG. 1C.

As shown in FIG. 2, each successive plot from plot 210C to plot 210F improves the MC. However, as discussed above, using 64 wordline address zones is not practical, and plot 210F is a theoretical optimum for illustration purposes. Thus, it can be shown that plot 210D, corresponding to three functions, provides performance that is comparable to the 64 wordline zones of plot 210E while minimizing computational and storage overhead.

As discussed above, initial functions may be programmed at the time of device manufacture. However, various factors during the operational life of the device may cause these initial functions to become outdated with respect to the optimal read thresholds.

Figure 3:
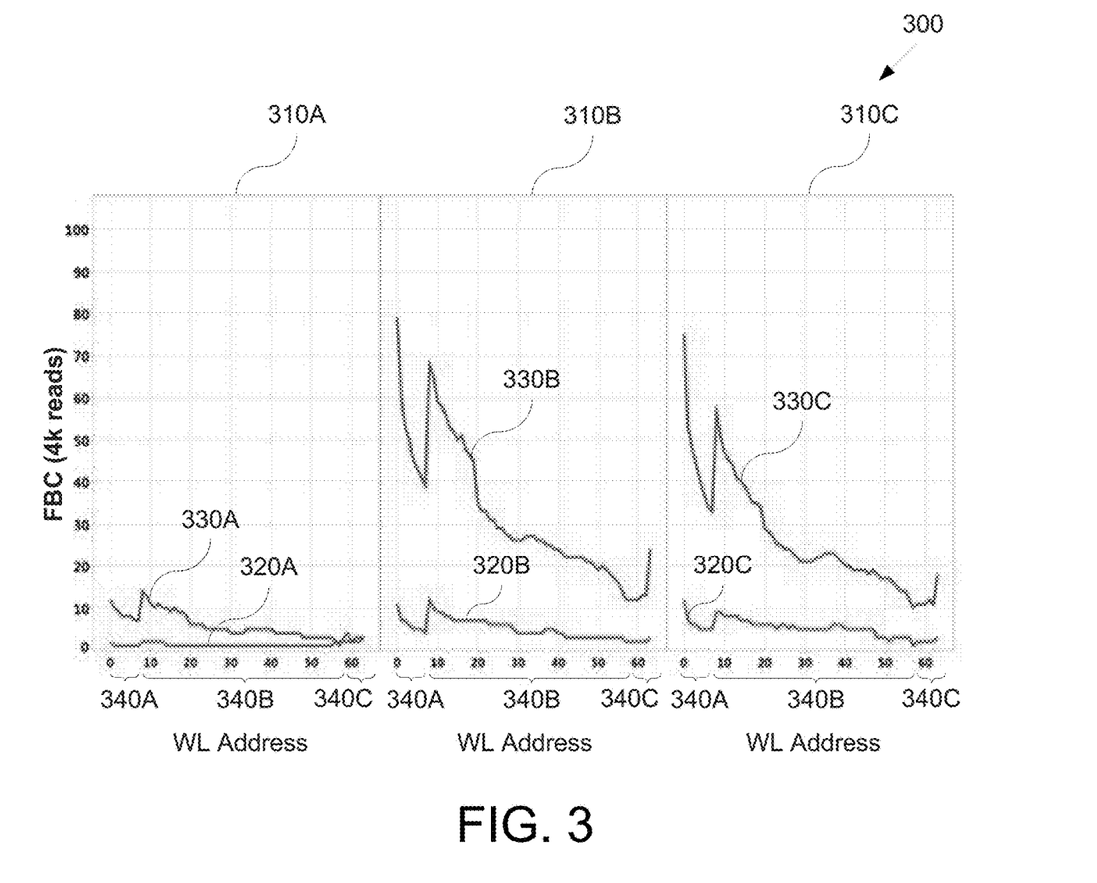
FIG. 3 is a graph diagram illustrating, before and after a temperature range transition, failed bit counts for sample reads with wordline addresses.

One such factor is temperature change, which is shown in FIG. 3, a graph diagram 300 illustrating, before and after a temperature range transition, failed bit counts for sample reads with wordline addresses. As shown in FIG. 3, a number of sample reads (e.g. 4K reads) may be conducted for a lower page 310A, a middle page 310B, and an upper page 310C of 64 wordline addresses in a block. The initial functions may associate each page 310A-310C with three wordline address zones 340A, 340B, and 340C. In certain aspects of the subject technology, the wordline address zones and functions may be shared for all pages. In other aspects, the wordline address zones and functions may be individual for each page.

Plots 320A, 320B, and 320C may correspond to sample reads conducted while the SSD is at an operating temperature of 85 degrees C. On the other hand, plots 330A, 330B, and 330C may correspond to sample reads conducted while the SSD is at an operating temperature of −2.5 degrees C. As shown in FIG. 3, the drastic reduction in temperature causes a significant increase in FBC. However, the general trends of the wordline address zones remain intact, as illustrated by the similar shapes of plot 320A with plot 330A, plot 320B with plot 330B, and plot 320C with plot 330C. As a result, by adjusting the slope and/or bias of the initial functions according to the temperature change, the effects of temperature changes on the optimal read thresholds can be mitigated.

One approach is to define a set of temperature ranges and slope adjustments in a lookup table, which can be stored in the SSD device. When a transition in operating temperature is detected, the functions can be adjusted according to the lookup table or a different set of functions may be selected. Another approach is to calculate slope adjustments on the fly after detecting a transition in operating temperature, for example by recalibrating the endpoint bias values in the address zones and using Equation 1 as described above to adjust the slopes. A combination of the two approaches may also be used.

Figure 4A:
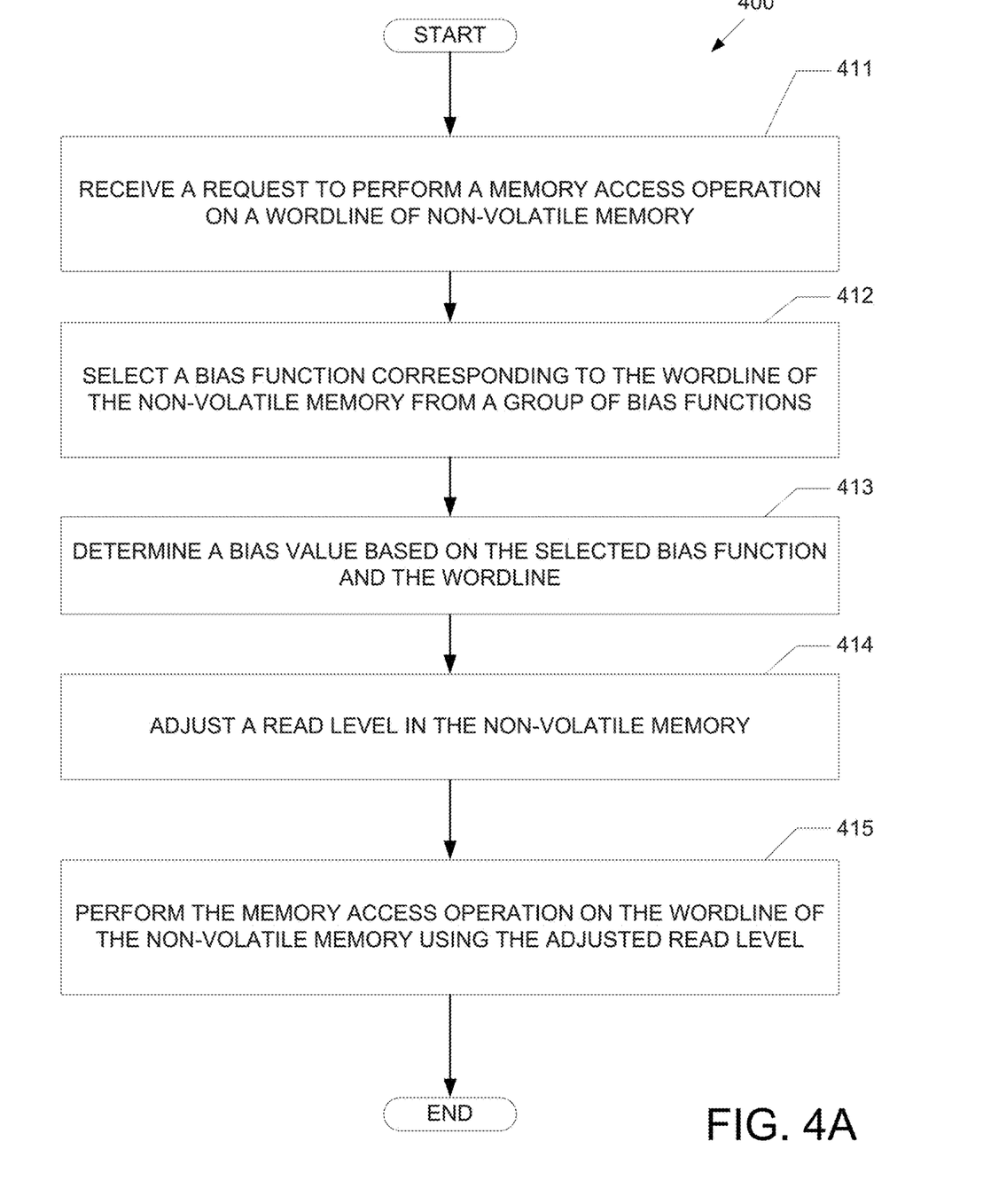
FIG. 4A is a flowchart illustrating an example process for adjusting read levels in a storage device.

FIG. 4A is a flowchart illustrating an example process 400 for adjusting read levels in a storage device, according to aspects of the subject technology. One or more blocks of FIG. 4A may be executed by a computing system (including, e.g., a data storage controller of an SSD, processor, or the like). Similarly, a non-transitory machine-readable medium may include machine-executable instructions thereon that, when executed by a computer or machine, perform the blocks of FIG. 4A.

In block 411, a controller receives a request to perform a memory operation on a wordline of non-volatile memory. For example, the controller may receive a read request to read a particular page of a wordline having a particular wordline address, which is contained in a particular block. The controller may correspond to, for example, controller 501 or controller 507, and the wordline may be contained in NAND memory cell array 508 of flash memory 503, as described below in conjunction with FIG. 5.

In block 412, the controller selects a bias function corresponding to the wordline selected from block 411 from a group of bias functions. As shown in FIG. 1E, each function 120A-120C may be associated with a respective corresponding wordline address zone 130D-130F. The controller may select the bias function having an associated wordline address zone that contains the wordline address of the read request in block 411. For example, referring to FIG. 1E, the controller may select from function 120A, 120B, or 120C based on whether the respective wordline address zone 130D-130F contains the wordline address of the read request from block 411.

In block 413, the controller determines a bias value based on the bias function selected from block 412 and the wordline requested from block 411. For example, block 413 may use the function determined in block 412 to determine a bias value for servicing the read request of block 411 based on a wordline address offset "i", as described above in conjunction with Equation 1.

In block 414, the controller adjusts a read level in the non-volatile memory based on the bias value from block 413. For example, if the bias value in block 413 is a positive bias of 0.125 mV, then read levels for associated wordlines can be adjusted upwards by adding 0.125 mV. In some aspects of the present technology, the controller may adjust bias values in registers 506 of FIG. 5, which may use integer values such as an 8-bit signed integer representing 0.125 mV increments between adjacent values. Since bias values may not be uniform across pages and across read thresholds between program states, the adjusted read levels may be on a per-page and/or per read threshold basis for a given wordline. The adjusted read levels may be applied to multiple blocks in an associated block group, such as a TT group.

In block 415, the controller performs the memory access operation on the wordline of the non-volatile memory using the adjusted read level of block 414. Thus, the controller can perform the request received from block 411 using the read level adjusted in block 414.

Figure 4B:
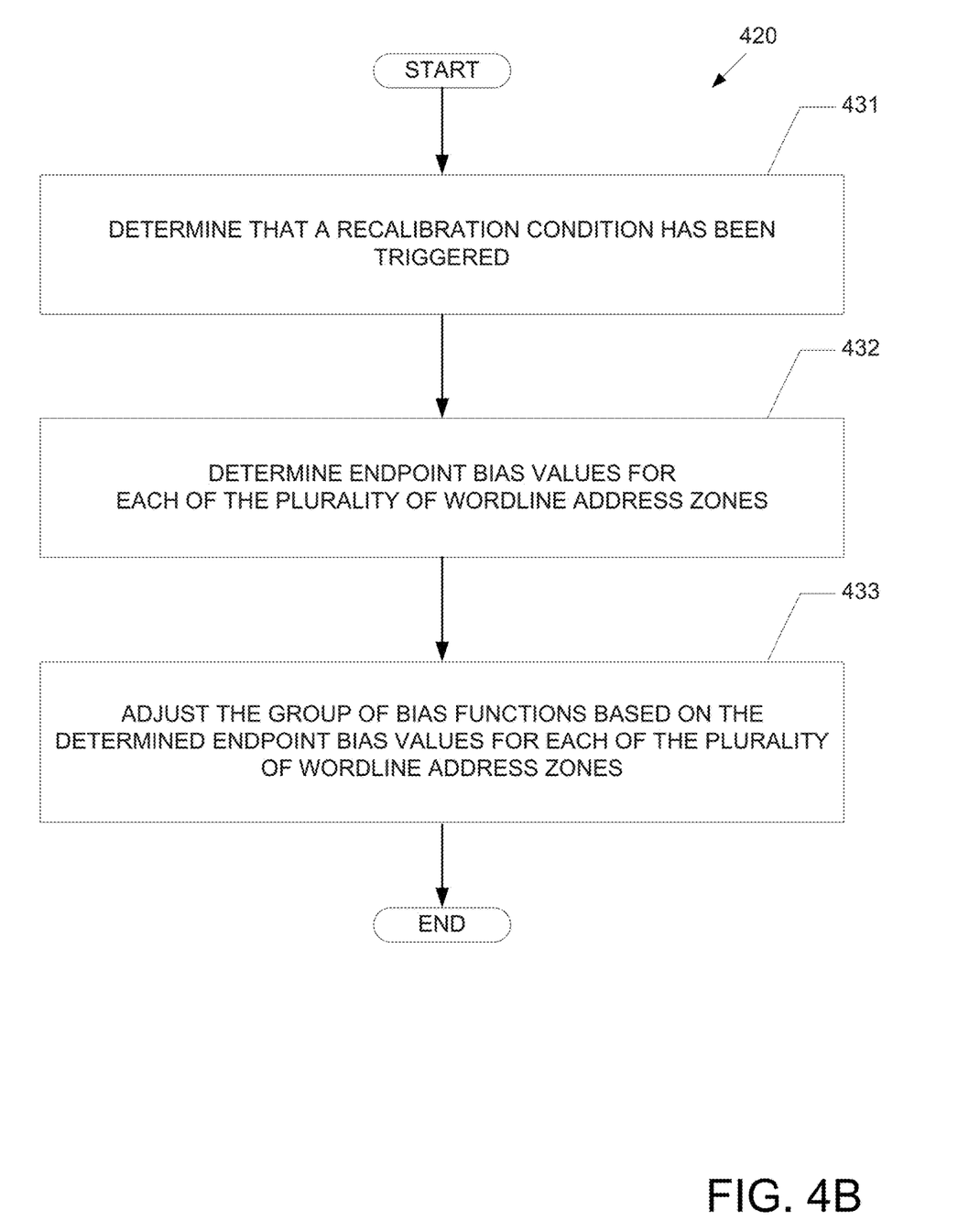
FIG. 4B is a flowchart illustrating an example process for recalibrating functions in response to a recalibration condition.

FIG. 4B is a flowchart illustrating an example process 420 for recalibrating functions in response to a recalibration condition, according to aspects of the subject technology. One or more blocks of FIG. 4B may be executed by a computing system (including, a data storage controller of an SSD, processor, or the like). Similarly, a non-transitory machine-readable medium may include machine-executable instructions thereon that, when executed by a computer or machine, perform the blocks of FIG. 4B.

In block 431, a controller determines that a recalibration condition has been triggered. The controller may correspond to the controller described above with respect to process 400 of FIG. 4A. For example, the recalibration condition may correspond to a storage device transitioning from a first operating temperature range (e.g. 80 C to 100 C) to a second operating temperature range (e.g. −30 C to −10 C), as described above with respect to FIG. 3. The controller may detect the recalibration condition by using a temperature sensor, for example. Another recalibration condition may correspond to a current operating temperature exceeding a threshold difference from a programming temperature of a particular block of memory cells, for example a block receiving a read request in process 400 described above. Yet another recalibration condition may correspond to a number of program/erase cycles for a particular block of memory cells exceeding a threshold value, indicating an aging of the block.

In block 432, the controller determines endpoint bias values for each of the plurality of wordline address zones associated with the functions. As discussed above, one approach is to utilize lookup tables. In this case, referring to FIG. 3, endpoint bias values can be retrieved from lookup tables for endpoint wordline addresses of wordline address zones 340A, 340B, and 340C. The endpoint bias values can also be measured on the fly, for example by using CVD tracking, BER Estimation Scan (BES), valley search, or other methods. Alternatively, a different set of functions can be selected, and the endpoint bias values can be determined based on the different set of functions.

For example, assume that wordline address zone 340A includes address 0 through address 10. In this case, endpoint bias values can be determined for the endpoint addresses, or address 0 and address 10. Similarly, endpoint bias values can be determined for the endpoint addresses of wordline address zones 340B and 340C.

In block 433, the controller adjusts the group of bias functions based on the endpoint bias values determined from block 432 for each of the plurality of wordline address zones. For example, the functions may be updated in working memory and optionally backed up to non-volatile memory. In another example, additional metadata may be provided that modifies the functions. In yet another example, one or more references, such as pointers, may be modified.

Figure 5:
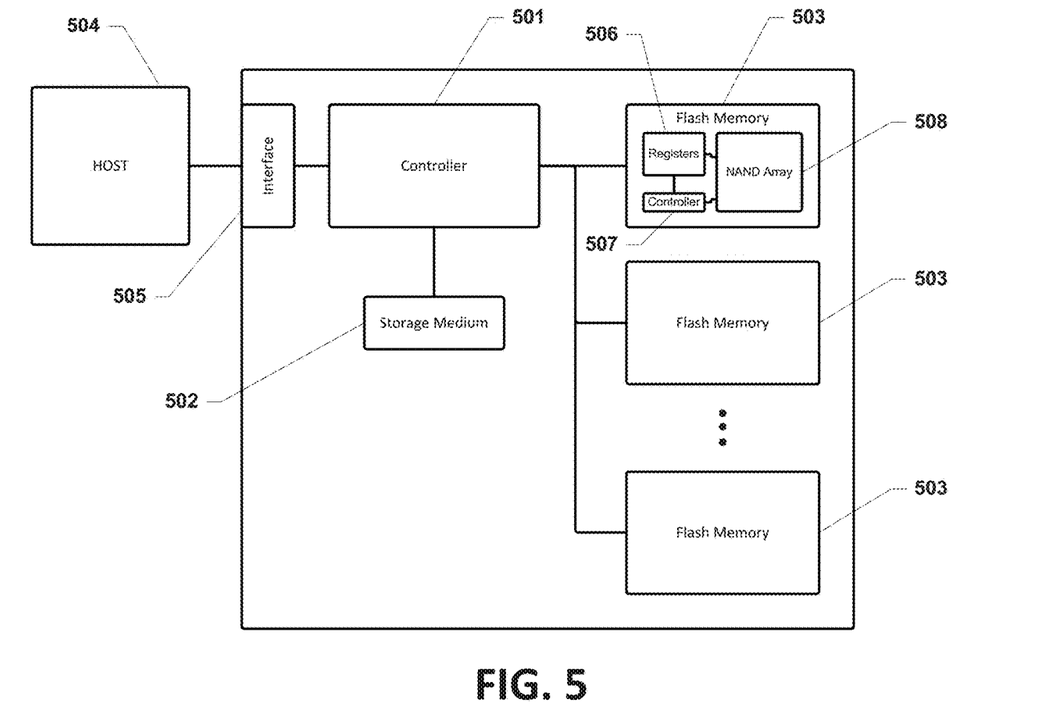
FIG. 5 is a block diagram illustrating components of an example data storage system.

FIG. 5 is a block diagram illustrating components of an example data storage system, according to aspects of the subject technology. As depicted in FIG. 5, in some aspects, data storage system 500 (e.g., a solid state drive) includes data storage controller 501, storage medium 502, and flash memory 503. Controller 501 may use storage medium 502 for temporary storage of data and information used to manage data storage system 500. Controller 501 may include several internal components (not shown) such as a read-only memory, a flash component interface (e.g., a multiplexer to manage instruction and data transport along a serial connection to flash memory 503), an I/O interface, error correction circuitry, and the like. In some aspects, all of these elements of controller 501 may be integrated into a single chip. In other aspects, these elements may be separated on their own PC board.

In some implementations, aspects of the subject disclosure may be implemented in data storage system 500. For example, aspects of the subject disclosure may be integrated with the function of data storage controller 501 or may be implemented as separate components for use in conjunction with data storage controller 501.

Controller 501 may also include a processor that may be configured to execute code or instructions to perform the operations and functionality described herein, manage request flow and address mappings, and to perform calculations and generate commands. The processor of controller 501 may be configured to monitor and/or control the operation of the components in data storage controller 501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 501 and/or its processor. One or more sequences of instructions may be software stored and read from storage medium 502, flash memory 503, or received from host device 504 (e.g., via host interface 505). ROM, storage medium 502, flash memory 503, represent examples of machine or computer readable media on which instructions/code executable by controller 501 and/or its processor may be stored. Machine or computer readable media may generally refer to any medium or media used to provide instructions to controller 501 and/or its processor, including volatile media, such as dynamic memory used for storage media 502 or for buffers within controller 501, and non-volatile media, such as electronic media, optical media, and magnetic media.

In some aspects, controller 501 may be configured to store data received from a host device 504 in flash memory 503 in response to a write command from host device 504. Controller 501 is further configured to read data stored in flash memory 503 and to transfer the read data to host device 504 in response to a read command from host device 504. As will be described in more detail below, controller 501 is also configured to predict when current read levels and/or settings are suspect and to estimate new read levels when it is predicted that the current read levels and/or settings need to be changed. If the estimated read levels are proven to be insufficient, controller 501 may be configured to perform further iterative adjustments to correct the read level parameters. By dynamically adjusting read levels of the memory 503, the subject technology may extend the number of program/erase operations that may be performed on memory cells within flash memory 503 in a particular application environment, and increase the endurance of the memory cells compared to the same application environment operating without the ability to dynamically adjust read levels.

Host device 504 represents any device configured to be coupled to data storage system 500 and to store data in data storage system 500. Host device 504 may be a computing system such as a personal computer, a server, a workstation, a laptop computer, PDA, smart phone, and the like. Alternatively, host device 504 may be an electronic device such as a digital camera, a digital audio player, a digital video recorder, and the like.

In some aspects, storage medium 502 represents volatile memory used to temporarily store data and information used to manage data storage system 500. According to aspects of the subject technology, storage medium 502 is random access memory (RAM) such as double data rate (DDR) RAM. Other types of RAM also may be used to implement storage medium 502. Memory 502 may be implemented using a single RAM module or multiple RAM modules. While storage medium 502 is depicted as being distinct from controller 501, those skilled in the art will recognize that storage medium 502 may be incorporated into controller 501 without departing from the scope of the subject technology. Alternatively, storage medium 502 may be a non-volatile memory such as a magnetic disk, flash memory, peripheral SSD, and the like.

As further depicted in FIG. 5, data storage system 500 may also include host interface 505. Host interface 505 may be configured to be operably coupled (e.g., by wired or wireless connection) to host device 504, to receive data from host device 504 and to send data to host device 504. Host interface 505 may include electrical and physical connections, or a wireless connection, for operably coupling host device 504 to controller 501 (e.g., via the I/O interface of controller 501). Host interface 505 may be configured to communicate data, addresses, and control signals between host device 504 and controller 501. Alternatively, the I/O interface of controller 501 may include and/or be combined with host interface 505. Host interface 505 may be configured to implement a standard interface, such as Serial-Attached SCSI (SAS), Fiber Channel interface, PCI Express (PCIe), SATA, USB, and the like. Host interface 505 may be configured to implement only one interface. Alternatively, host interface 505 (and/or the I/O interface of controller 501) may be configured to implement multiple interfaces, which may be individually selectable using a configuration parameter selected by a user or programmed at the time of assembly. Host interface 505 may include one or more buffers for buffering transmissions between host device 504 and controller 501.

Flash memory 503 represents a non-volatile memory device for storing data. According to aspects of the subject technology, flash memory 503 includes, for example, a NAND flash memory. Flash memory 503 may include a single flash memory device or chip, or, as depicted by FIG. 5, may include multiple flash memory devices or chips arranged in multiple channels. Flash memory 503 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In aspects, the interface of flash memory 503 is used to access one or more internal registers 506 and an internal flash controller 507 for communication by external devices. In some aspects, registers 506 may include address, command, and/or data registers, which internally retrieve and output the necessary data to and from a NAND memory cell array 508. For example, a data register may include data to be stored in memory array 508, or data after a fetch from memory array 508, and may also be used for temporary data storage and/or act like a buffer. An address register may store the memory address from which data will be fetched to host 504 or the address to which data will be sent and stored. In some aspects, a command register is included to control parity, interrupt control, and the like. In some aspects, internal flash controller 507 is accessible via a control register to control the general behavior of flash memory 503. Internal flash controller 507 and/or the control register may control the number of stop bits, word length, receiver clock source, and may also control switching the addressing mode, paging control, coprocessor control, and the like.

In some aspects, registers 506 may also include a test register. The test register may be accessed by specific addresses and/or data combinations provided at the interface of flash memory 503 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 503 (e.g., read levels) to dynamically vary how data is read from the memory cells of memory arrays 508.

It should be understood that in all cases data may not always be the result of a command received from host 504 and/or returned to host 504. In some aspects, Controller 501 may be configured to execute a read operation independent of host 504 (e.g., to verify read levels or BER), The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method comprising:
   receiving a request to perform a memory access operation on a wordline of non-volatile memory;
   selecting a bias equation corresponding to the wordline of the non-volatile memory from a group of bias equations;
   determining a bias value based on the selected bias equation and the wordline;
   adjusting a read level in the non-volatile memory based on the bias value; and
   performing the memory access operation on the wordline of the non-volatile memory using the adjusted read level,
   wherein the bias value is not generated or stored prior to selecting the bias equation,
   wherein the group of bias equations corresponds to a plurality of wordline address zones, each bias equation of the group corresponding to a respective zone of the plurality of wordline address zones,
   wherein the bias equation, for the respective zone, is one of:
      a constant bias value, for the respective zone, calculated from averaging read thresholds within a respective zone of the plurality of wordline address zones;
      a linear equation, for the respective zone, having a slope and an endpoint bias value; or
      an equation, for the respective zone, having a higher order than the linear equation.

2. The method of claim 1, wherein the bias equation is the linear equation.

3. The method of claim 1, wherein selecting the bias equation further comprises determining a wordline address zone of the plurality of wordline address zones containing an address of the wordline.

4. The method of claim 3, further comprising:
   determining that a recalibration condition has been triggered;
   determining endpoint bias values for each of the plurality of wordline address zones; and
   adjusting the group of bias equations based on the determined endpoint bias values for each of the plurality of wordline address zones.

5. The method of claim 4, wherein the recalibration condition comprises the non-volatile memory transitioning from a first operating temperature range into a second operating temperature range.

6. The method of claim 1, further comprising:
   selecting the group of bias equations from a plurality of groups of bias equations corresponding to a block group of the non-volatile memory containing the wordline.

7. The method of claim 1, wherein the non-volatile memory is a NAND flash memory.

8. A non-transitory machine-readable medium including machine-executable instructions thereon that, when executed by a processor, perform a method comprising:
   receiving a request to perform a memory access operation on a wordline of non-volatile memory;
   selecting a bias equation corresponding to the wordline of the non-volatile memory from a group of bias equations;
   determining a bias value based on the selected bias equation and the wordline;
   adjusting a read level in the non-volatile memory based on the bias value; and
   performing the memory access operation on the wordline of the non-volatile memory using the adjusted read level,
   wherein the bias value is not generated or stored prior to selecting the bias equation,
   wherein the group of bias equations corresponds to a plurality of wordline address zones, wherein the bias equation is one of:
    a constant bias value calculated based on read thresholds within a respective zone of the plurality of wordline address zones;
    a linear equation having a slope and an endpoint bias value; or
    an equation having a higher order than the linear equation.

9. The non-transitory machine-readable medium of claim 8, wherein the bias equation is a linear function.

10. The non-transitory machine-readable medium of claim 8, wherein selecting the bias equation further comprises determining a wordline address zone of the plurality of wordline address zones containing an address of the wordline.

11. The non-transitory machine-readable medium of claim 10, wherein the method further comprises:
    determining that a recalibration condition has been triggered;
    determining endpoint bias values for each of the plurality of wordline address zones; and
    adjusting the group of bias equations based on the determined endpoint bias values for each of the plurality of wordline address zones.

12. The non-transitory machine-readable medium of claim 11, wherein the recalibration condition comprises the non-volatile memory transitioning from a first operating temperature range into a second operating temperature range.

13. The non-transitory machine-readable medium of claim 8, wherein the method further comprises:
    selecting the group of bias equations from a plurality of groups of bias equations corresponding to a block group of the non-volatile memory containing the wordline.

14. The non-transitory machine-readable medium of claim 8, wherein the non-volatile memory is a NAND flash memory.

15. A system, comprising:
    a processor;
    a non-volatile memory;
    a memory media having instructions stored thereon that, when executed by the processor, cause the processor to:
        receive a request to perform a memory access operation on a wordline of the non-volatile memory;
        select a bias equation corresponding to the wordline of the non-volatile memory from a group of bias equations;
        determine a bias value based on the selected bias equation and the wordline;
        adjust a read level in the non-volatile memory based on the bias value; and
    perform the memory access operation on the wordline of the non-volatile memory using the adjusted read level,
    wherein the bias value is not generated or stored in the memory media prior to selecting the bias equation,
    wherein the group of bias equations corresponds to a plurality of wordline address zones,
    wherein the bias equation is one of:
        a constant bias value calculated based on read thresholds within a respective zone of the plurality of wordline address zones;
        a linear equation having a slope and an endpoint bias value; or
        an equation having a higher order than the linear equation.

16. The system of claim 15, wherein the bias equation is a linear function.

17. The system of claim 15, wherein selecting the bias equation further comprises determining a wordline address zone of the plurality of wordline address zones containing an address of the wordline.

18. The system of claim 17, wherein the instructions are further configured to cause the processor to:
    determine that a recalibration condition has been triggered;
    determine endpoint bias values for each of the plurality of wordline address zones; and
    adjust the group of bias equations based on the determined endpoint bias values for each of the plurality of wordline address zones.

19. The system of claim 18, wherein the recalibration condition comprises the non-volatile memory transitioning from a first operating temperature range into a second operating temperature range.

20. The system of claim 15, wherein the instructions are further configured to cause the processor to:
    select the group of bias equations from a plurality of groups of bias equations corresponding to a block group of the non-volatile memory containing the wordline.

21. The system of claim 15, wherein the non-volatile memory is a NAND flash memory.

22. A system comprising:
    one or more controllers, wherein the one or more controllers comprise: means for receiving a request to perform a memory access operation on a wordline of non-volatile memory; means for selecting a bias equation corresponding to the wordline of the non-volatile memory from a group of bias equations; means for determining a bias value based on the selected bias equation and the wordline;
means for adjusting a read level in the non-volatile memory based on the bias value; and
means for performing the memory access operation on the wordline of the non-volatile memory using the adjusted read level, wherein the bias value is not generated or stored in the system prior to selecting the bias equation, wherein the group of bias equations corresponds to a plurality of wordline address zones, wherein the bias equation is one of: a constant bias value calculated based on read thresholds within a respective zone of the plurality of wordline address zones; a linear equation having a slope and an endpoint bias value; or an equation having a higher order than the linear equation.

23. The system of claim 22, wherein the bias equation is a linear function.

24. The system of claim 22, wherein the means for selecting the bias equation further comprises means for determining a wordline address zone of the plurality of wordline address zones containing an address of the wordline.

25. The system of claim 24, wherein the one or more controllers further comprise: means for determining that a recalibration condition has been triggered; means for determining endpoint bias values for each of the plurality of wordline address zones; and
    means for adjusting the group of bias equations based on the determined endpoint bias values for each of the plurality of wordline address zones.

26. The system of claim 25, wherein the recalibration condition comprises the non-volatile memory transitioning from a first operating temperature range into a second operating temperature range.

27. The system of claim 22, wherein the one or more controllers further comprise: means for selecting the group of bias equations from a plurality of groups of bias equations corresponding to a block group of the non-volatile memory containing the wordline.

28. The system of claim 22, wherein the non-volatile memory is a NAND flash memory.

* * * * *